United States Patent
Lee

[11] Patent Number: 5,994,201
[45] Date of Patent: Nov. 30, 1999

[54] METHOD FOR MANUFACTURING SHALLOW TRENCH ISOLATION REGIONS

[75] Inventor: Tzung-Han Lee, Taipei, Taiwan

[73] Assignee: United Microelectronics Corp., Hsinchu, Taiwan

[21] Appl. No.: 09/170,436

[22] Filed: Oct. 13, 1998

[30] Foreign Application Priority Data

Jul. 14, 1998 [TW] Taiwan ................................. 87111394

[51] Int. Cl.$^6$ ................................................. H01L 21/76
[52] U.S. Cl. .......................... 438/427; 438/424; 438/435; 438/437; 148/DIG. 50
[58] Field of Search .................................. 438/424, 427, 438/428, 433, 425, 435, 436, 437, 438; 148/DIG. 50

[56] References Cited

U.S. PATENT DOCUMENTS

| 5,229,316 | 7/1993 | Lee et al. ........................... 148/DIG. 50 |
| 5,382,541 | 1/1995 | Bajor et al. ............................... 438/427 |
| 5,397,731 | 3/1995 | Takemura ................................. 438/427 |
| 5,506,168 | 4/1996 | Morita et al. ............................. 438/424 |

Primary Examiner—Trung Dang
Attorney, Agent, or Firm—Hickman Stephens & Coleman, LLP

[57] ABSTRACT

A method for manufacturing shallow trench isolation regions according to the invention uses a first stop layer and a second stop layer as two polishing stop layers, or a polishing stop layer and an etching stop layer, respectively. By performing chemical mechanical polishing twice, or performing chemical mechanical polishing one time and then etch back, the influence on subsequently formed shallow trench isolation regions caused by different sizes and densities thereof can be greatly alleviated.

20 Claims, 4 Drawing Sheets

METHOD FOR MANUFACTURING SHALLOW TRENCH ISOLATION REGIONS

CROSS-REFERENCE TO RELATED APPLICATION

This application claims the priority benefit of Taiwan serial no. 87111394, filed Jul. 14, 1998, the full disclosure of which is incorporated herein by reference.

BACKGROUND OF THE INVENTION

1. Field of the Invention

The invention relates to a method for manufacturing semiconductors, and in particular to a method for manufacturing shallow trench isolation (STI) regions.

2. Description of the Related Art

It is well known that a device isolation region is used to electrically separate two adjacent devices from each other, thereby preventing an unexpected carrier flow therebetween in a substrate. For example, a typical device isolation region is formed between two field effect transistors (FETs) in a densely-packed IC, such as a DRAM so as to reduce a charge leakage between the FETs. In general, the device isolation region is formed by the LOCOS process. Since the LOCOS process has been increasingly matured, a device isolation structure with low cost and high reliability can be obtained by using the LOCOS process. However, the LOCOS process creates an unexpected stress and a bird's break around the device isolation structure. A device isolation structure with a bird's beak formed by the LOCOS process cannot efficiently insolate two adjacent devices from each other, particularly two adjacent small-small devices.

Due to the poor insulation of the device isolation region formed by the LOCOS process, it is intended to replace the device isolation structure with a scalable shallow trench isolation structure in a high density IC.

In a shallow trench isolation process, a trench is formed in a semiconductor substrate by anisotropic etching, and then the trench is filled with oxide to insulate two adjacent devices from each other, thereby forming a shallow trench isolation region. Since the formed shallow trench isolation structure is scalable and has no bird's beak encroachment as stated in the traditional LOCOS process, the shallow trench isolation process is suitable for the CMOS manufacturing.

FIGS. 1A–1E shows a method for manufacturing shallow trench isolation regions. First, referring to FIG. 1A, a pad oxide layer 102 is formed on a silicon substrate 100 by thermal oxidation, wherein the pad oxide layer 102 is used to protect the surface of the silicon substrate 100. Then, a silicon nitride layer 104 is formed on the pad oxide layer 102 by low pressure chemical vapor deposition (LPCVD).

Referring to FIG. 1B, a photoresist (not shown) is formed on the silicon nitride layer 104 and then the silicon nitride layer 104, the pad oxide layer 102 and the silicon substrate 100 are etched to form trenches 110 and 112 in the silicon substrate 100. After that, the photoresist is removed.

Referring to 1C, a liner oxide layer 114 is formed on the inner surfaces of the trenches 110 and 112 by high-temperature thermal oxidation, wherein the liner oxide layer 114 extends to the top corners 120 of the trenches 110 and 112 to contact the pad oxide layer 102. Subsequently, the trenches 110 and 112 are filled with an insulator 116, such as a silicon oxide layer, by atmospheric pressure chemical vapor deposition (APCVD).

Referring to FIG. 1D, excessive part of the insulator 116 is removed by chemical mechanical polishing until the surface of the silicon nitride layer 104 is exposed, wherein the silicon nitride layer 104 functions as a polishing stop layer.

Referring to FIG. 1E, the silicon nitride layer 104 is removed to expose the pad oxide layer 102. Thereafter, the pad oxide layer 102 is removed by a hydrofluoric acid solution. As a result, shallow trench isolation regions 118a and 118b are formed.

However, in the prior method, there is a problem of non-uniformity owing to the different densities and sizes of the trenches 110 and 112. Furthermore, it is necessary to over-polish the insulator 116 to ensure that the insulator 116 cannot remain on the silicon nitride at all. This results in a first dent 130 created on the isolation region 118b, known as a dishing effect. Apart from the first dent 130, second dents 140 are formed at the top corners 120 during wet etching for removing the pad oxide layer 102 by a hydrofluoric acid solution, causing a kink effect. The kink effect not only decrease the threshold voltage of devices, but also cause a leakage current on the devices because corner parasitic MOSFETs relative to active regions are formed.

SUMMARY TO THE INVENTION

In view of the above, a first object of the invention is to provide a method for manufacturing shallow trench isolation regions, which makes the control on chemical mechanical polishing easier and avoids the dishing effect by improving the uniformity of chemical mechanical polishing.

A second object of the invention is to provide a method for manufacturing shallow trench isolation regions, which avoids the kink effect caused by the dents on the top corners of isolation regions thereby to improve the performance of the devices.

To achieve the above-stated objects, a method for manufacturing shallow trench isolation regions according to the invention comprises the following steps. First, a substrate is provided. A pad oxide layer is formed on the substrate. A first stop layer is formed on the pad oxide layer. A dielectric layer is formed on the first stop layer. A second stop layer is formed on the dielectric layer. The second stop layer, the dielectric layer, the first stop layer, the pad oxide layer and the substrate are patterned to form trenches in the substrate. A liner oxide layer is formed on the inner surfaces of the trenches. An insulator is formed over the substrate. Part of the insulator is removed until the surface of the second stop layer is exposed. The second stop layer is removed by using the dielectric layer as an etching stop layer. The dielectric layer is removed by using the first stop layer as an etching stop. Part of the insulator is removed until the insulator has the same level as the first stop layer. The first stop layer is removed. Finally, the pad oxide layer is removed.

During the formation of shallow trench isolation regions, the first stop layer and the second stop layer function as two polishing stop layers, or a polishing stop layer and an etching stop layer, respectively. By performing chemical mechanical polishing twice, or performing chemical mechanical polishing one time, and then etch back, the influence on the formed shallow trench isolation regions caused by different sizes and densities thereof can be greatly alleviated.

Accordingly, the method for manufacturing shallow trench isolation regions of the invention can efficiently improve the uniformity of the shallow trench isolation regions and avoid the dishing effect. In addition, the method can also prevent the kink effect caused by the dents along the boundary of the substrate and the shallow trench regions. As a result, the method can efficiently increase the performance of devices.

BRIEF DESCRIPTION OF THE DRAWINGS

The present invention will be more fully understood from the detailed description given hereinbelow and the accompanying drawings which are given by way of illustration only, and thus does not limit the present invention, and wherein.

DETAILED DESCRIPTION OF THE EMBODIMENTS

FIGS. 2A–2F shows a method for manufacturing shallow trench isolation regions according to a preferred embodiment of the invention.

Figure 1A:
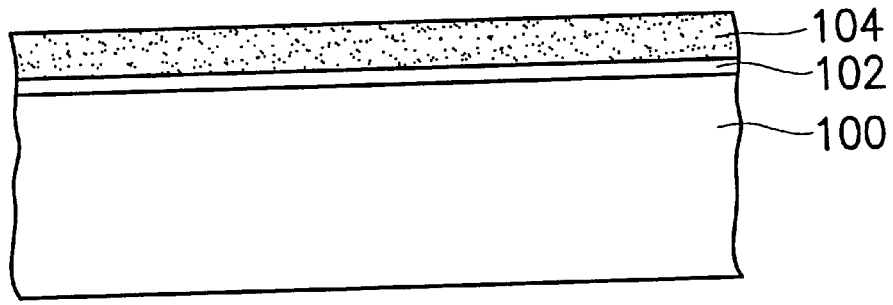
FIGS. 1A–1E are cross-sectional views illustrating a method for manufacturing shallow trench isolation regions according to the prior art.
Figure 1B:
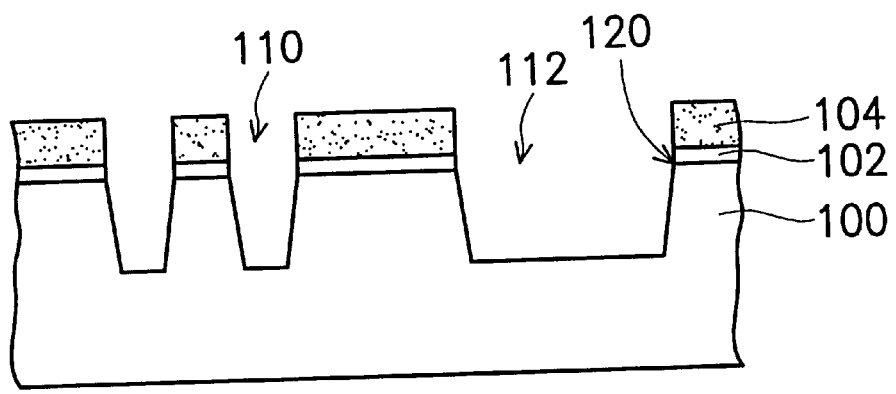
Figure 1C:
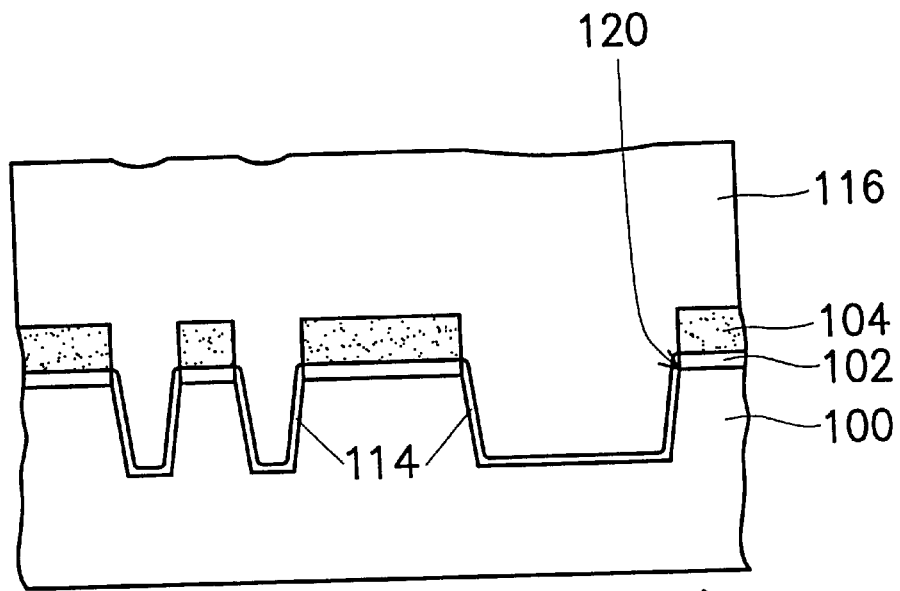
Figure 1D:
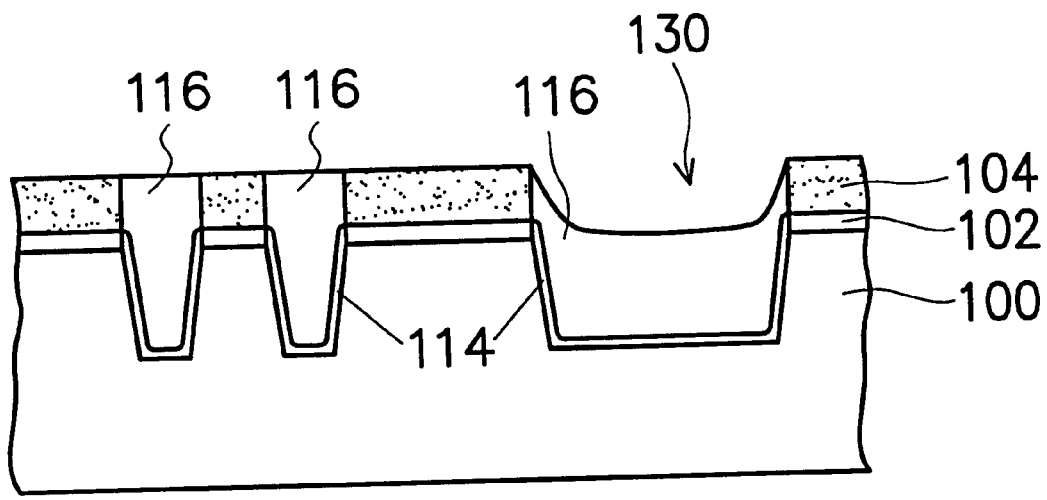
Figure 1E:
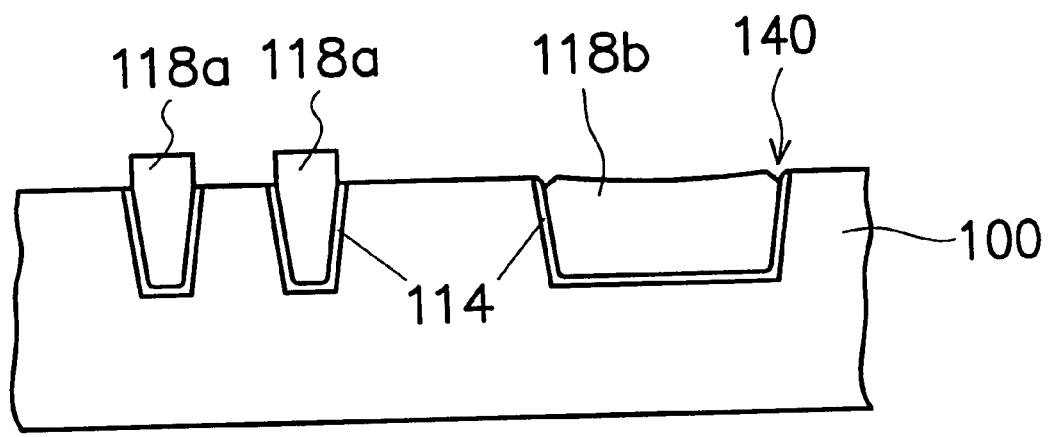
Figure 2A:
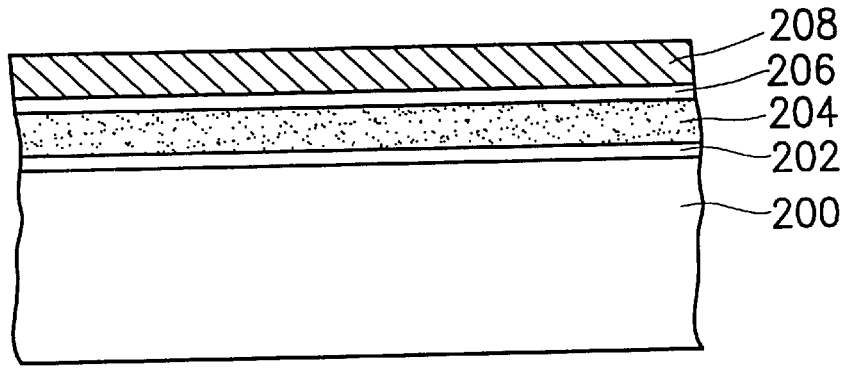
FIGS. 2A–2F are cross-sectional views illustrating a method for manufacturing shallow trench isolation regions according to a preferred embodiment of the invention.

First, referring to FIG. 2A, a pad oxide layer 202 is formed on a provided substrate 200, such as a P-type silicon substrate, by, for example thermal oxidation. Next, a first stop layer 204, such as a silicon nitride layer, is formed on the pad oxide layer 202 by, for example, low pressure chemical vapor deposition. A dielectric layer 206, such as a silicon oxide layer, is formed on the first stop layer 204 by, for example, chemical vapor deposition. A second stop layer 208, such as a polysilicon layer, is formed on the dielectric layer 206 by, for example, chemical vapor deposition. Moreover, the dielectric layer 206 has an etching rate different from those of the stop layers 204 and 206.

Figure 2B:
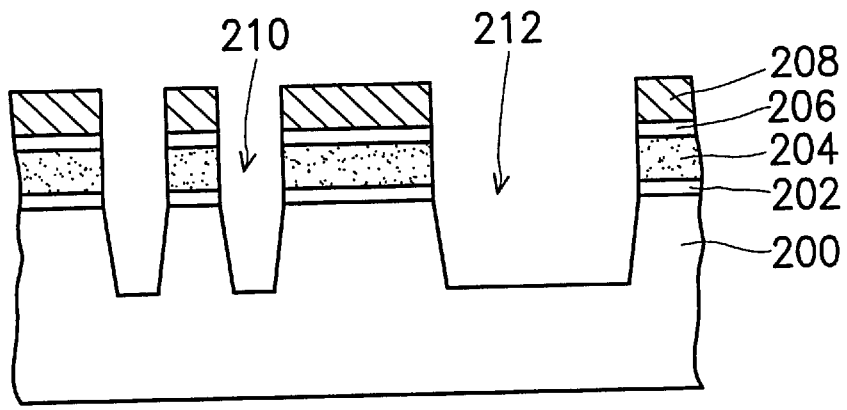

Referring to FIG. 2B, a patterned photoresist (not shown) is formed on the second stop layer 208. Thereafter, the second stop layer 208, the dielectric layer 206, the first stop layer 204, the pad oxide layer and the substrate 200 are etched to form trenches 210 and 212. Then, the patterned photoresist is removed.

Figure 2C:
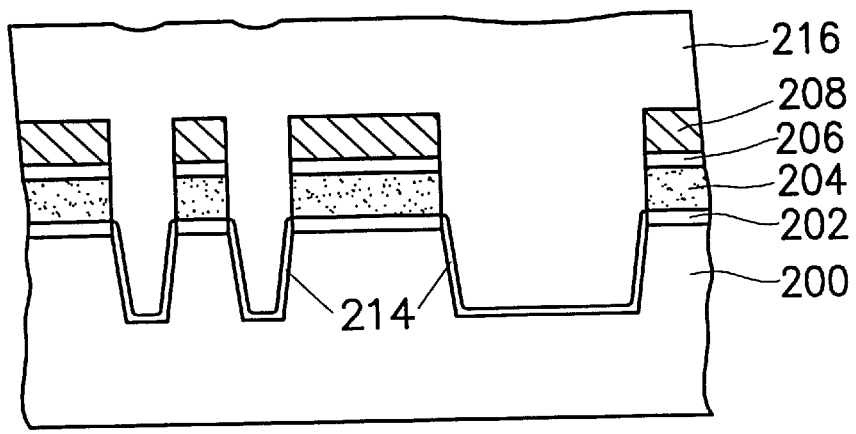

Referring to FIG. 2C, a liner oxide layer 214 is formed on the inner surfaces of the trenches 210 and 212 by, for example, high-temperature thermal oxidation, wherein the liner oxide layer 214 extends to contact the pad oxide layer 202. Then, an insulator 216, which covers the second stop layer 208 and fills the trenches 210 and 212, is formed over the substrate 200. As an example for forming the insulator 216, a TEOS gas, serving as a reaction gas, is used to form a silicon oxide layer by atmospheric chemical vapor deposition, and then the silicon oxide is further heated at a temperature of 1,000° C. for 10–30 minutes for strengthening.

Figure 2D:
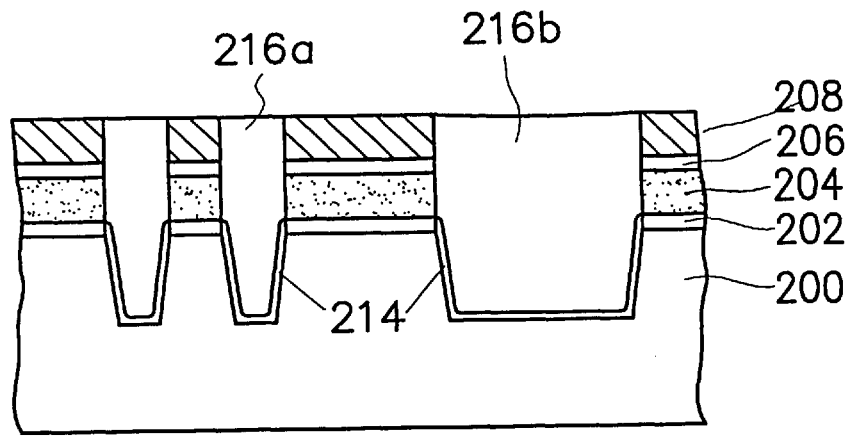

Referring to FIG. 2D, with the second stop layer 208 functioning as an etching stop layer, part of the insulator 216 is removed by, for example, chemical mechanical polishing until the surface of the second stop layer 208 is exposed. After that, only insulators 216a and 216b are remained.

Figure 2E:
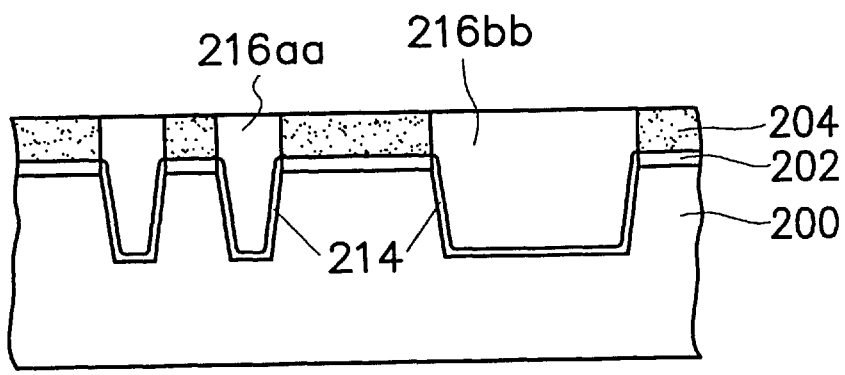

Referring to FIG. 2E, with the dielectric layer 206 functioning as an etching stop layer, the second stop layer 208 is removed by, for example wet etching or dry etching. Next, using the first stop layer 204 as an etching stop layer, the dielectric layer 206 is removed. Thereafter, with the first stop layer 204 functioning as a polishing stop layer or an etching stop layer, part of the insulators 216a and 216b is removed to form insulators 216aa and 216bb, for example, chemical mechanical polishing or anisotropic etching.

Figure 2F:
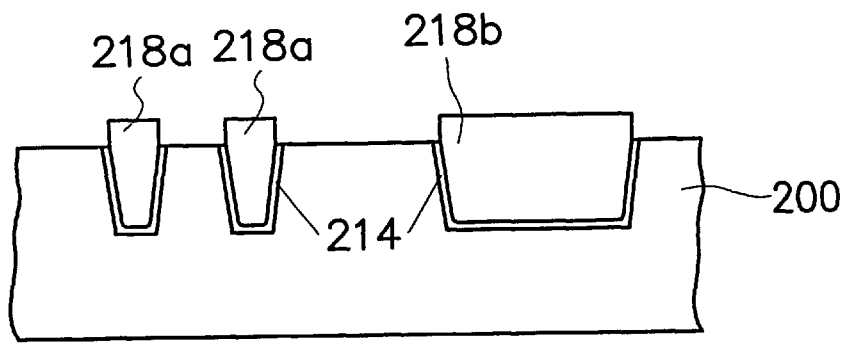

Referring to FIG. 2F, the first stop layer 204 and the pad oxide layer 202 are removed in order to form shallow trench isolation regions 218a and 218b. For example, the first stop layer 204 is removed by wet etching, using a phosphoric acid solution, until the surface of the pas oxide layer 202 is exposed, and then the pad oxide layer 202 is removed by wet etching, using a hydrofluoric acid solution.

As can be obviously seen from the above, during the formation of shallow trench isolation regions, the first stop layer and the second stop layer function as two polishing stop layers, or a polishing stop layer and an etching stop layer, respectively. By performing chemical mechanical polishing twice, or performing chemical mechanical polishing one time, and then etch back, the influence on the formed shallow trench isolation regions caused by different sizes and densities thereof can be greatly alleviated.

Accordingly, the method for manufacturing shallow trench isolation regions of the invention can efficiently improve the uniformity of the shallow trench isolation regions and avoid the dishing effect. In addition, the method can also prevent the kink effect caused by the dents along the boundary of the substrate and the shallow trench regions. As a result, the method can efficiently increase the performance of devices.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangement.

What is claimed is:

1. A method for manufacturing shallow trench isolation (STI) regions, comprising the steps of:

providing a substrate;

forming a pad oxide layer on the substrate;

forming a first stop layer on the pad oxide layer;

forming a dielectric layer on the first stop layer;

forming a second stop layer on the dielectric layer;

patterning the second stop layer, the dielectric layer, the first stop layer, the pad oxide layer and the substrate to form trenches in the substrate;

forming a liner oxide layer on the inner surfaces of the trenches;

forming an insulator over the substrate;

removing part of the insulator until the surface of the second stop layer is exposed;

removing the second stop layer by using the dielectric layer as an etching stop;

removing the dielectric layer by using the first stop layer as an etching stop;

removing part of the insulator until the insulator has the same level as the first stop layer;

removing the first stop layer; and removing the pad oxide layer.

2. The method as claimed in claim 1, wherein the pad oxide layer is formed by thermal oxidation.

3. The method as claimed in claim 1, wherein the first stop layer is a silicon nitride layer.

4. The method as claimed in claim 1, wherein the dielectric layer has an etching rate different from those of the first stop layer and the second stop layer.

5. The method as claimed in claim 4, wherein the dielectric layer is a silicon oxide layer.

6. The method as claimed in claim 4, wherein the second stop layer is a polysilicon layer.

7. The method as claimed in claim 1, wherein the insulator is a silicon oxide layer.

8. The method as claimed in claim 1, wherein the step of removing part of the insulator to expose the second stop layer is performed by chemical mechanical polishing.

9. The method as claimed in claim 1, wherein the steps of removing the second stop layer and the dielectric layer are performed by wet etching.

10. The method as claimed in claim 1, wherein the steps of removing the second stop layer and the dielectric layer are performed by dry etching.

11. The method as claimed in claim 1, wherein the step of removing part of the insulator until the insulator has the same level as the first stop layer is performed by chemical mechanical polishing.

12. The method as claimed in claim 1, wherein the step of removing parts of the insulator until the insulator has the same level as the first stop layer is performed by etch back.

13. The method as claimed in claim 12, wherein the step of removing part of the insulator until the insulator has the same level as the first stop layer is performed by anisotropic etching.

14. A method for manufacturing shallow trench isolation regions, comprising the steps of:

provniding a substrate;

forming a pad oxide layer on the substrate;

forming a silicon nitride layer on the pad oxide layer;

forming a silicon oxide layer on the silicon nitride layer;

forming a polysilicon layer on the silicon oxide layer;

patterning the polysilicon layer, the silicon oxide layer, the silicon nitride layer, pad oxide layer and the substrate to form trenches in the substrate;

forming a liner oxide layer on the inner surfaces of the trenches;

forming an insulator over the substrate;

removing part of the insulator by chemical mechanical polishing until the surface of the polysilicon layer is exposed, wherein the polysilicon layer functions as a polishing stop;

removing the polysilicon layer by using the silicon oxide layer as an etching stop;

removing the silicon oxide layer by using the silicon nitride layer as an etching stop;

removing part of the insulator by chemical mechanical polishing until the insulator has the same level as the silicon nitride layer, wherein the silicon nitride layer functions as a polishing stop;

removing the silicon nitride layer; and removing the pad oxide layer.

15. A method as claimed in claim 14, wherein the steps of removing the polysilicon and the silicon oxide are performed by wet etching.

16. The method as claimed in claim 14, wherein the steps of removing the polysilicon and the silicon oxide are performed by dry etching.

17. A method for manufacturing shallow trench isolation regions, comprising the steps of:

providing a substrate;

forming a pad oxide layer on the substrate;

forming a silicon nitride layer on the pad oxide layer;

forming a polysilicon layer on the silicon oxide layer;

forming a silicon oxide layer on the silicon nitride layer;

patterning the polysilicon layer, the silicon oxide layer, the silicon nitride layer, the pad oxide layer and the substrate to form trenches in the substrate;

forming a liner oxide layer on the inner surface of the trench;

forming an insulator over the substrate;

removing part of the insulator by chemical mechanical polishing until the surface of the polysilicon layer is exposed, wherein the polysilicon layer functions as a polishing stop layer;

removing the polysilicon layer by using the silicon oxide layer as an etching stop layer;

removing the silicon oxide layer by using the silicon nitride layer as an etching stop layer;

removing part of the insulator by etch back until the insulator has the same level as the silicon nitride layer, wherein the silicon nitride layer functions as an etching stop;

removing the silicon nitride layer; and removing the pad oxide layer.

18. The method as claimed in claim 17, wherein the steps of removing the polysilicon layer and the silicon oxide layer are performed by wet etching.

19. The method as claimed in claim 17, wherein the steps of removing the polysilicon layer and the silicon oxide layer are performed by dry etching.

20. The method as claimed in claim 17, wherein the etch back is an anisotropic etching process.

* * * * *